United States Patent
Mantegazza

(10) Patent No.: US 11,087,854 B1
(45) Date of Patent: Aug. 10, 2021

(54) HIGH CURRENT FAST READ SCHEME FOR CROSSPOINT MEMORY

(71) Applicant: Intel Corporation, Santa Clara, CA (US)

(72) Inventor: Davide Mantegazza, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/810,127

(22) Filed: Mar. 5, 2020

(51) Int. Cl.
| G11C 7/00 | (2006.01) |
| G11C 16/34 | (2006.01) |
| G11C 16/12 | (2006.01) |
| G11C 11/56 | (2006.01) |
| G11C 11/4091 | (2006.01) |
| G11C 11/408 | (2006.01) |
| G11C 16/26 | (2006.01) |

(52) U.S. Cl.
CPC ...... *G11C 16/3431* (2013.01); *G11C 11/4085* (2013.01); *G11C 11/4091* (2013.01); *G11C 11/5678* (2013.01); *G11C 16/12* (2013.01); *G11C 16/26* (2013.01)

(58) Field of Classification Search
CPC ............ G11C 16/3431; G11C 11/4085; G11C 11/4091; G11C 11/5678; G11C 16/12; G11C 16/26
USPC .................................................. 365/222, 205
See application file for complete search history.

(56) References Cited

U.S. PATENT DOCUMENTS

| 9,025,392 | B1* | 5/2015 | Bolandrina | G11C 13/0004 365/189.06 |
| 10,032,508 | B1* | 7/2018 | Srinivasan | G11C 13/0061 |
| 2010/0165719 | A1* | 7/2010 | Pellizzer | G11C 13/0069 365/163 |
| 2010/0182825 | A1* | 7/2010 | Lowrey | G11C 13/0004 365/163 |
| 2014/0016396 | A1* | 1/2014 | Mazumder | G11C 13/004 365/148 |
| 2014/0056055 | A1* | 2/2014 | Ikeda | H01L 27/2481 365/148 |
| 2015/0063012 | A1* | 3/2015 | Jung | G11C 7/06 365/158 |
| 2015/0262661 | A1* | 9/2015 | Chu | G11C 13/0061 365/163 |
| 2016/0093351 | A1* | 3/2016 | Jung | G11C 11/1673 365/158 |
| 2016/0133319 | A1* | 5/2016 | Fantini | G11C 13/0004 365/163 |
| 2016/0225819 | A1* | 8/2016 | Toh | H01L 27/228 |
| 2019/0267082 | A1* | 8/2019 | Parkinson | G11C 13/0009 |

* cited by examiner

*Primary Examiner* — Viet Q Nguyen
(74) *Attorney, Agent, or Firm* — Compass IP Law, PC

(57) ABSTRACT

A high current fast read scheme can enable improved read disturb without negatively impacting read performance. In one example, a fast read scheme involves applying a higher current as soon as the cell thresholds. In one example, circuitry detects the threshold event and turns on a bypass control transistor to bypass the circuitry applying the read voltage to enable a higher voltage and therefore higher current as soon as possible. The read time can thus be decreased (or at least not increased) and read disturb improved.

20 Claims, 6 Drawing Sheets

| 500 | READ NOT STARTED | READ | | |
|---|---|---|---|---|
| | | PRE-THRESHOLD t=0 | POST-THRESHOLD t=1 | POST-THRESHOLD t=2 |
| WL_Read_Bias | 0V | -xV | -xV | -xV |
| Fast-Detection Node | 0V | -xV + 400mV | -xV + 600mV | -xV - 1V |
| Snap_Reference | 0V | -xV + 400mV | -xV + 400mV | -xV + 400mV |
| By-pass control | 0V | -3V | -3V | +3V |
| By-pass transistor | Off | Off | Off | On |
| By-pass switch | Off | On | On | Off |

FIG. 5

HIGH CURRENT FAST READ SCHEME FOR CROSSPOINT MEMORY

FIELD

The descriptions are generally related to memory, and more particularly, to improved techniques for accessing crosspoint memory.

BACKGROUND

Memory resources have innumerable applications in electronic devices and other computing environments. There is demand for memory technologies that can scale smaller than traditional memory devices. However, continued drive to smaller and more energy efficient devices has resulted in scaling issues with traditional memory devices. Three-dimensional memory devices emerged as a solution to the scaling limitations of traditional memory devices.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing at least one implementation of the invention that includes one or more particular features, structures, or characteristics. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 5 is a table showing an example of operation of the circuit of FIG. 4 for performance of a fast bypass read.

Descriptions of certain details and implementations follow, including a description of the figures, which may depict some or all of the embodiments described below, as well as discussing other potential embodiments or implementations of the inventive concepts presented herein.

DETAILED DESCRIPTION

A high current fast read scheme for crosspoint memories is described.

Reading a crosspoint memory cell can result in read disturb (RD). Reading a crosspoint memory cell typically involves applying a read voltage across the memory cell and sensing current through the cell. Application of the read voltage may be sufficient to cause the memory cell's state to change. Therefore, after the sensing operation, a current can be applied to the memory cell to recover from the read disturb and restore the memory cell to the correct state.

Conventional techniques involve first applying a relatively low read voltage with little to no current supplied in order to perform the sensing operation. In conventional techniques, a high current cannot be applied during the sensing operation because of limitations on the read voltage. After the sensing operation, a higher current is supplied to repair read disturb. However, such techniques may be insufficient to fix all read disturb cases, increase the read time, and may even have the potential to increase the read disturb problem.

In contrast, a high current fast read scheme involves applying a higher current as soon as the cell thresholds. In one example, circuitry detects the threshold event and turns on a bypass control transistor to bypass the circuitry applying the read voltage to enable a higher voltage and therefore higher current as soon as possible. The read time can thus be decreased and read disturb improved.

Figure 1:
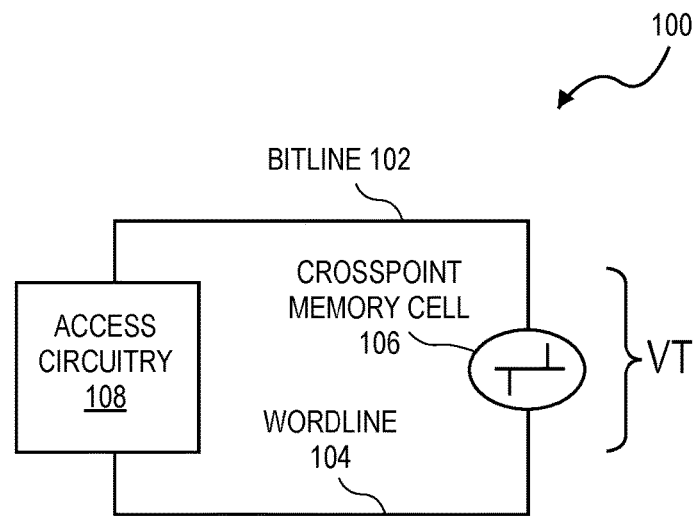
FIG. 1 is an example of a memory cell.

FIG. 1 is circuit diagram of an example of a two-terminal crosspoint memory cell. The crosspoint memory cell is one of many memory cells in a crosspoint memory device. The crosspoint memory cell 106 is coupled with access circuitry via a bitline 102 and a wordline 104. The crosspoint memory cell 106 includes a material to store one or more bits. The memory element of the crosspoint memory cell 106 can include any memory element with a tunable threshold voltage. In one example, the cell 106 can be in one of multiple (e.g., 2, 4 or more) resistive states. In one such example, each different resistive state is associated with a different threshold voltage (VT). A threshold voltage is a voltage at which the cell 106 undergoes a change (e.g., a physical change) that causes the cell to be in a higher conductive state. In one example, a memory cell can be said to "threshold" or undergo a "threshold event." In one example, when a memory cell thresholds (e.g., in response to an applied voltage with a magnitude greater than the threshold voltage at the current state), the memory cell undergoes a physical change that causes the memory cell to exhibit a certain electrical characteristics, such as high conductivity. Once a cell thresholds, a program current of a particular amplitude, polarity, and duration can be applied to the cell to cause the cell to be in the desired resistive state. The value stored by the crosspoint memory cell 106 can therefore be determined by detecting the resistive state of the cell, which can be determined by detecting the current that flows through the cell in response to an applied voltage.

The memory cell 106 is coupled with circuitry 108 to enable access to and operation of the memory cell 106. The circuitry includes electronic components that are electrically coupled to perform one or more of: supplying voltages to the memory cell, sensing electrical responses of the memory cell, performing analog or logic operations on received or stored information, outputting information, and storing information. In one example, the access circuitry 108 includes circuitry to select memory cells, write to memory cells, and read from memory cells.

Figure 2:
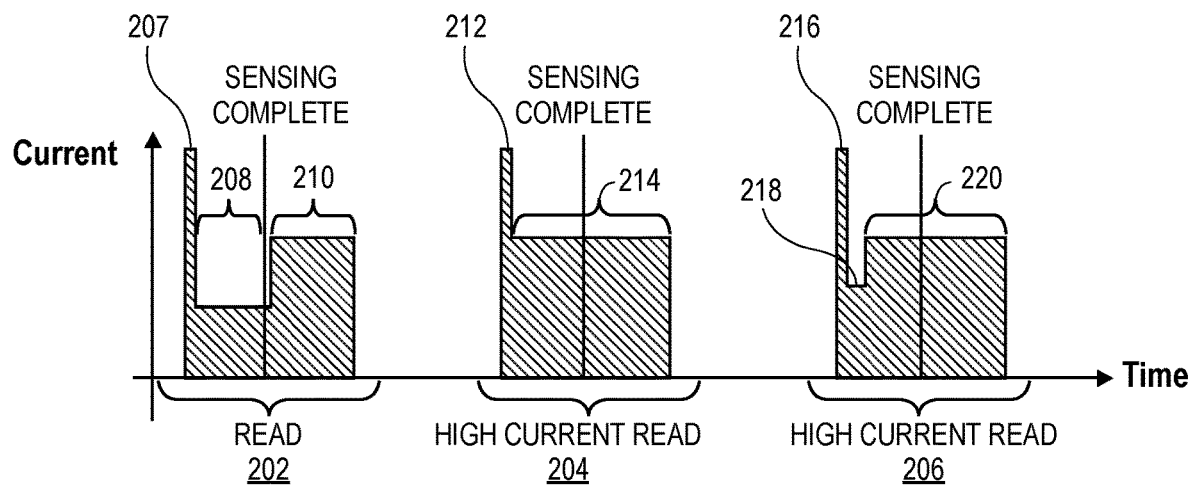
FIG. 2 illustrates an example of current waveforms for performing a read operation.

To write to a crosspoint memory cell, such as the cell 106, typically a voltage is applied across the memory cell followed by application of current. FIG. 2 illustrates an example of current waveforms for performing a read operation. FIG. 2 shows an example of a typical read waveform 202 and two examples of high current read waveforms 204 and 206. In all the illustrated waveforms 202 and 204, there is a current spike 216, 212, respectively. The current spikes 207, 212, and 216 represent a spike in current after selection of the memory cell that can result in or contribute to read disturb.

In the typical read waveform 202, there is a relatively low sensing current 208 applied after the current spike 216. The low sensing current 208 is provided to perform the sensing operation. In a typical read, the amplitude of the sensing current 208 is limited by the read voltage applied across the memory cell. The read amplitude of the voltage applied across the memory cell is limited by the threshold voltage distributions of the memory cells in different states. Therefore, the sensing current 208 is typically limited to a relatively low magnitude. Once the sensing is completed and the state of read bit (e.g., SET/1) is secured, then a higher supply voltage can be applied without risk of selecting a RESET/0 bit (since sensing of SET/1 bit already completed). With higher supply voltage, a higher current can be applied to fix or improve the Read-Disturb (RD) problem. The duration that the higher current is applied can significantly change the effectiveness of recovering from read disturb. Applying the maximum current for a longer time can enable fully recovering from read disturb. However, in the typical read waveform, in order to apply the maximum current for longer, the time of the read operation would be increased, which would negatively impact performance. Thus, only after the sensing operation is complete, a larger magnitude current 210 is applied to the memory cell to correct any read disturb effects resulting from the read operation, which may result in sub-optimal read disturb correction.

In contrast, the high current read waveforms 204 and 206 apply a higher current even before the sensing operation is complete. The waveform 204 represents a more ideal case in which the higher current 214 is applied immediately and for the entire duration of the sensing operation. The waveform 206 represents an example in which an initial lower current 218 is applied for a short time followed by a higher current 220 as soon as the memory cell thresholds. In one example, the higher current 214 and 220 has a magnitude that is greater than the current through the memory cell at the read or select voltage. In one example, the higher current 214 and 220 has a magnitude that is greater than 50% of the reset current. For example, the magnitude of the higher current can be in a range of approximately 50-80% of the reset current magnitude. However, the current 214 and 220 can have a magnitude outside of this range that is higher than the current through the cell at the read voltage.

Because the higher current is applied as soon as the memory cell thresholds, the higher current can be applied for longer; the additional time at the higher current can be taken from the selection portion of the read rather than increasing the read time. Thus, the improved read disturb correction can be achieved with the longer duration at a higher current without affecting the read-performance (completion time).

Note that the sensing operation completes at the same time for the typical read and the high current reads. There are typically some timing constraints due to the distribution of threshold voltages that prevent completion of the sensing operation. For example, some high threshold voltage memory cells may threshold later than other memory cells. Thus, in one such example, the timing of completion of the sensing operation is typically limited by the high threshold cells. In the typical read waveform 202, the higher current 210 is not applied to the cell until completion of the sensing operation. Therefore, the higher current is provided later and for a shorter duration. In contrast, in the high current read waveforms, the higher current 214 and 220 is applied as soon as the memory cell thresholds, and therefore may be applied at a significantly earlier time and for a longer duration that in the typical read.

Figure 3:
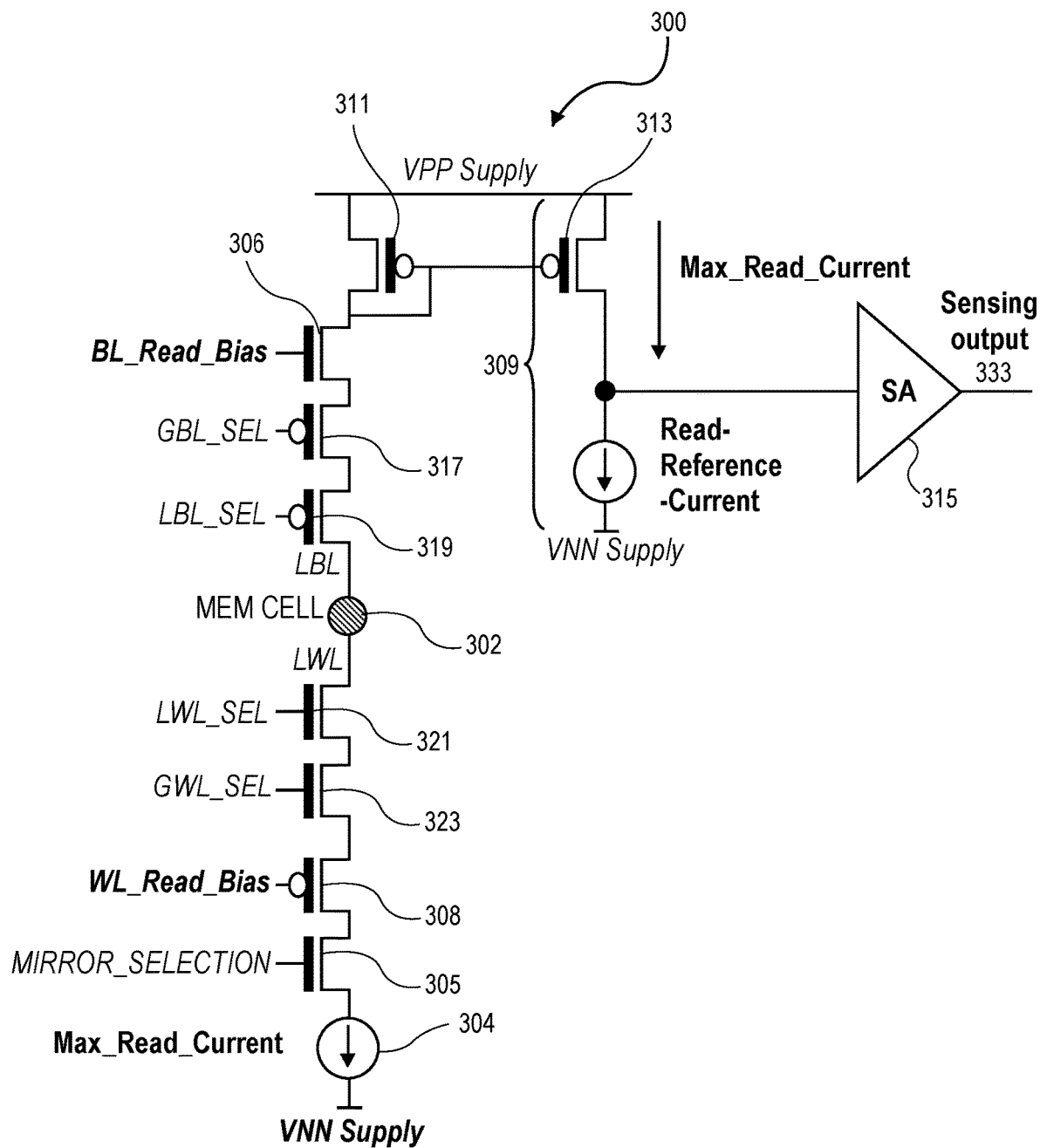
FIG. 3 illustrates an example of a circuit topology with a crosspoint memory cell.

FIG. 3 illustrates an example of a circuit topology with a crosspoint memory cell. The circuit 300 includes a single memory cell 302. The memory cell 302 can be the same as, or similar to, the memory cell 106 described above with respect to FIG. 1. In the illustrated example, the memory cell 302 has one terminal that is coupled with the supply voltage VPP and another terminal that is coupled with the supply voltage VNN. In this example, VPP is on the bitline side and VNN is on the wordline side, so the supply voltages could alternatively be referred to as bitline supply voltage and the wordline supply voltage, respectively. In one example, VPP is the maximum positive supply voltage and VNN is the maximum negative supply voltage.

The circuit 300 also includes selection transistors (which can also be referred to as decoding transistors) between the memory cells and the supply voltages. For example, the circuit includes a global bit line selection transistor 317, a local bit line selection transistor 319, a local word line selection transistor 321, and a global word line selection transistor 323. Corresponding signals are applied to the gates of the selection transistors to select the memory cell 302. For example, a global bitline select (GBL_SEL) signal is applied to the gate of the global bitline select transistor 317. A local bitline select (LBL_SEL) signal is applied to the gate of the local bitline select transistor 319. A local wordline select (LWL_SEL) signal is applied to the gate of the local wordline select transistor 321. A global wordline select (GWL_SEL) signal is applied to the gate of the global wordlines select transistor 323. Turning on the selection transistors (e.g., by applying a pre-determined voltage to the gate of the transistors) selects the cell for reading or writing.

The circuit 300 includes transistors to enable application of a voltage across the memory cell. For example, in the example illustrated in FIG. 3, the transistor 306 on the bitline side and the transistor 308 on the wordline side enable application of a voltage across the memory cell 302. The voltage applied across the memory cell depends on the operation being performed. For ease of reference, a voltage applied across the memory cell for performing a read operation will be referred to as a read voltage (however, a read voltage may alternatively be referred to as a read bias, a selection voltage, a selection bias, or a read-selection bias).

The circuit 300 includes sense circuitry to sense the logic state stored by the memory cell. Once a read voltage is applied across the memory cell, the memory cell 302 will either threshold or not threshold in response to the applied voltage. In one example, if the cell thresholds, the cell will enter a high conductivity or low resistance state causing the cell to conduct a higher current. If the cell does not threshold, the cell will not conduct current (or rather, will conduct a very low current such as a leakage current). The current through the memory cell will be mirrored in the path 309. In the illustrated example, the current is mirrored with the current mirror formed by the matched transistors 311 and 313. The current through the path 309 is compared with a reference current (Read-Reference-Current) with the sense amplifier 315. The output of the sense amplifier (sensing output 333) will switch depending on whether the current is greater than or less than the reference current. Thus, the output of the sense amplifier 315 is indicative of the logic state stored in the memory cell 302.

A read operation of a typical crosspoint memory cell may result in read disturb. For example, once the read voltage is applied, a memory cell in a low threshold-voltage or low-resistance state, depending on the specific storage memory technology which is employed, will be selected. In some crosspoint memory with a selector, the selector may have a non-linear Current-Voltage (I-V) characteristic that induces a high current spike flowing in the cell post selection. The read-selection spike can cause a read disturb problem, which is generally solved by applying a current through the selected sell to fix the read disturb problem. For example, if the storage/memory element is a phase change memory (PCM) element then the read disturb may corresponds to a partial or total amorphization of the storage element. At this point, a current can be applied to restore the crystalline state of the storage element. The circuit 300 includes a current source (e.g., current mirror 304) to provide the current to restore the state of the cell.

The current to restore the state of the memory cell can be relatively large in magnitude. As mentioned above, the applied read voltage may limit the current through the memory cell. For example, the bias between the WL selector (LWL_SEL) and the WL source follower (transistor 308) may significantly limit the current through the memory cell 302 in FIG. 3. One solution is to bypass the WL source follower (transistor 308) once the detection operation is completed. For example, in a current sensing scheme, once the current post-snap is detected at the sense amplifier 315, the transistor 308 can be bypassed and the wordline path can be connected with the VNN supply to deliver the higher current needed to restore the state of the memory cell.

Thus, the read scheme illustrated in FIG. 3 delivers either no current (e.g., for a Full-Float-Read, where sensing happens in voltage) or minimum current to sense the cell when the read voltage is applied. The higher current delivered to recover from read-disturb is limited in the magnitude during the read due to limitations arising from the read voltage applied, and may require switching to a different supply voltage after the sensing operation is complete to deliver the higher current. Not only does the limited current applied during the read increase the read time, the limited current applied during a typical read might also result in an increase in the read disturb problem (e.g., due to the need to compensate the lower currents with longer time or due to a switch to a different/higher supply bias to deliver the required higher current).

Figure 4:
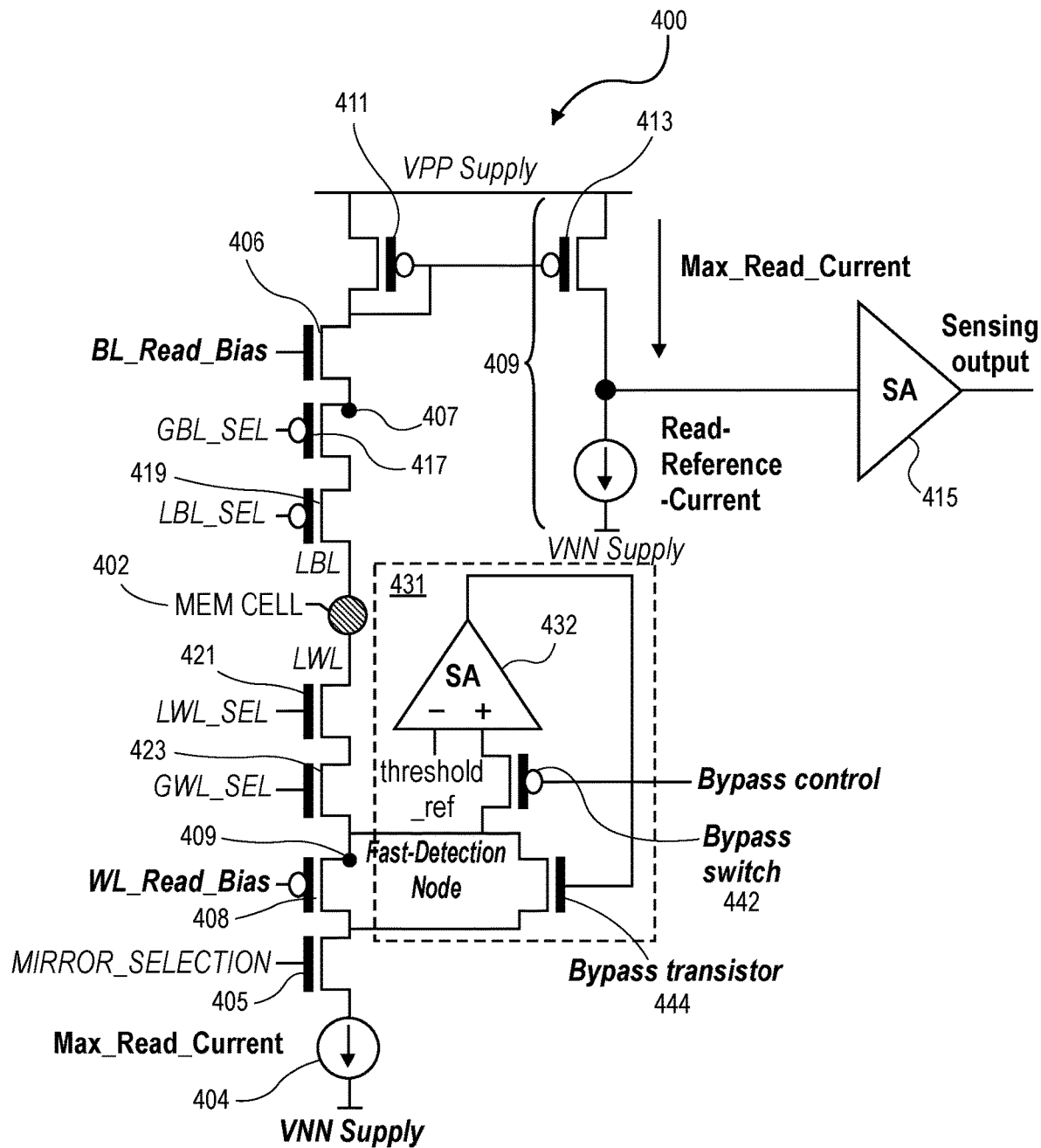
FIG. 4 illustrates an example of a circuit topology to perform a high current fast read.

In contrast, FIG. 4 illustrates an example of a circuit topology to perform a high current fast read. The circuit 400 is similar to the circuit in FIG. 3 in that it includes a single memory cell 402. The memory cell 402 can be the same as, or similar to, the memory cell 106 described above with respect to FIG. 1. Like in FIG. 3, the memory cell 402 of the circuit 400 has one terminal that is coupled with the supply voltage VPP and another terminal that is coupled with the supply voltage VNN. In one example, VPP is the maximum positive supply voltage and VNN is the maximum negative supply voltage. However, the supply voltages may be different than illustrated in FIG. 4 (e.g., the bitline supply voltage may be negative and the wordline supply voltage may be positive, or both supply voltages can have the same polarity).

Also, similar to FIG. 3, the circuit 400 of FIG. 4 includes selection transistors (which can also be referred to as decoding transistors) between the memory cells and the supply voltages. For example, the circuit includes a global bit line selection transistor 417, a local bit line selection transistor 419, a local word line selection transistor 421, and a global word line selection transistor 423. Corresponding signals are applied to the gates of the selection transistors to select the memory cell 402. For example, a global bitline select (GBL_SEL) signal is applied to the gate of the global bitline select transistor 417. A local bitline select (LBL_SEL) signal is applied to the gate of the local bitline select transistor 419. A local wordline select (LWL_SEL) signal is applied to the gate of the local wordline select transistor 421. A global wordline select (GWL_SEL) signal is applied to the gate of the global wordlines select transistor 423. Turning on the selection transistors (e.g., by applying a pre-determined voltage to the gate of the transistors) selects the cell for reading or writing. In the illustrated example, the transistors 417 and 419 are connected to VPP and transistors 421 and 423 are connected to VNN. Thus, in the illustrated example, transistors 417 and 419 are shown as PMOS transistors and transistors 421 and 423 are shown as NMOS transistors.

The circuit 400 includes transistors to enable application of a voltage across the memory cell. For example, in the example illustrated in FIG. 4, the transistor 406 on the bitline side and the transistor 408 on the wordline side enable application of a voltage across the memory cell 402. In one example, the transistors 406 and 408 are cascode transistors. For example, the transistor 406 on the bitline side can include a cascode transistor that passes a bias applied to the gate to its source. In this way, the voltage (e.g., BL_Read_Bias) applied to the gate of the transistor 406 can be applied to the node 407 at the source of transistor 406. Similarly, the transistor 408 on the wordline side can be a cascode transistor to pass the voltage applied to the gate to the bulk (given that the transistor 408 in the illustrated example is a PMOS transistor). In this way, the voltage applied to the gate of the transistor 408 (e.g., WL_Read_Bias) can be applied to the node 455 at the source of transistor 408.

One technique for generating the bias across the memory cell is to apply a portion of the read voltage on the bitline side and a portion of the read voltage on the wordline side. For example, to cause a voltage difference of X across the memory cell 402, X/2 can be applied on the bitline side and −X/2 can be applied on the wordline side. Alternative biasing schemes can also be used. In the example illustrated in FIG. 4, a read bias is applied across the memory cell by applying a positive voltage (BL_Read_Bias) on the bitline side and a negative voltage (e.g., WL_Read_Bias) on the wordline side. Applying a voltage to the gate of one of the transistors involves bringing the gate to the desired voltage relative to another baseline level (e.g., ground or other baseline level). Applying a voltage can involve applying a pulse or pulses or otherwise bringing the node in the circuit to the desired voltage. A voltage or current pulse is typically a rapid and transient change (e.g., increase or decrease) in voltage or current, respectively. For example, a voltage pulse may be defined as a rapid change from a first voltage level to a second voltage level, followed by a rapid return to the first voltage level. Pulses can have a variety of durations and shapes, such as rectangular, triangular, or other shapes.

Also similar to the circuit 300 of FIG. 3, the circuit 400 includes sensing circuitry to sense the logic state stored by the memory cell. Once a read voltage is applied across the memory cell, the memory cell 402 will either threshold or not threshold in response to the applied voltage. In one example, if the cell thresholds, the cell will enter a high conductivity or low resistance state causing the cell to conduct a higher current. If the cell does not threshold, the cell will not conduct current (or rather, will conduct a very low current such as a leakage current). The current through the memory cell will be mirrored in the path 409. In the illustrated example, the current is mirrored with the current mirror formed by the matched transistors 411 and 413. The current through the path 409 is compared with a reference current (Read-Reference-Current) with the sense amplifier 415. The output of the sense amplifier 415 will switch depending on whether the current is greater than or less than the reference current. Thus, the output of the sense amplifier 415 is indicative of the logic state stored in the memory cell 402. Note that the sense amplifier 415 of FIG. 4 could include a voltage or current sense amplifier.

As mentioned above, a read operation may result in a change in the state of the memory cell. Therefore, a current may be applied to the memory cell to restore the correct logic state of the cell. The circuit 400 includes a current source (e.g., current mirror 404) to provide the current to restore the state of the cell. However, unlike in typical cells in which the higher restorative current is applied only after the sensing operation is complete, the circuit 400 of FIG. 4 includes a fast bypass mechanism to enable applying a high current as soon as possible after thresholding of a cell (e.g., as soon as thresholding of the cell is detected). In one example, the bypass mechanism includes circuitry to detect thresholding of the memory cell and bypass the circuitry applying the read voltage responsive to the detection of thresholding of the memory cell. In one example, detecting thresholding of the memory cell involves detection of a change in voltage or current at a node between a selection transistor and the circuitry applying the read voltage.

The example in FIG. 4 includes bypass circuitry 431 coupled across the transistor 408 to create a path bypassing the circuitry generating the wordline-side read voltage (WL_Read_Bias). In this example, the voltage generated at the wordline is immediately used (via a feedback loop) to bypass the circuitry generating the wordline-side read voltage. This bypass operation is completed as soon as the memory cell thresholds enabling a higher current to be quickly delivered to the memory cell. Unlike in conventional reads, there is no need to wait a fixed (and typically relatively long) time that may be required to select high threshold voltage cells. Additionally, the feedback loop in the example of FIG. 4 is entirely analog and does not require any additional controls or logic.

In the example illustrated in FIG. 4, the bypass circuitry 431 includes a sense amplifier (SA) 432 and two bypass transistors 442 and 444. For ease of understanding when referring to the bypass transistors 442 and 444, the transistor 442 will be referred to as the "bypass switch" and the transistor 444 will be referred to as the "bypass transistor." In the illustrated example, the sense amplifier 432 is a voltage sense amplifier to detect a difference in voltage between its two input terminals. However, a current sense amplifier may be used in place of voltage sense amplifier. Referring to sense amplifier 432, the positive input terminal (+input) is coupled with the source terminal of the source follower transistor 408 via the bypass switch 442. Note that in this example, the source terminal of the transistor 408 is where the threshold (snap) signal is generated and detected, and therefore the node 455 is referred to herein as the fast-detection node. Referring again to the sense amplifier 432, the negative input terminal (−input) of the sense amplifier 432 is coupled with a reference voltage (threshold_ref). The negative input terminal of the sense amplifier 432 is to be pre-charged before (or at the beginning) of the read operation to ensure the sense amplifier output flips state correctly depending on the state of the memory cell to be read.

In the example illustrated in FIG. 4, the connection between source terminal of the transistor 408 and the positive input of the sense amplifier 432 is controlled by the bypass switch 442. The bypass transistor 444 is coupled across the terminals of the transistor 408 to enable bypassing the transistor (and therefore bypassing the circuitry generating the read voltage). The bypass switch 442 is in turn controlled by the output of the sense amplifier 432. As can be seen in FIG. 4, the output of the sense amplifier 432 is coupled with the gates of both the bypass switch 442 and the bypass transistor 444.

In this example, the bypass switch 442 and the bypass transistor 444 have different (e.g., opposite) voltage polarities. For example, the bypass switch 442 is depicted as a PMOS transistor and the bypass transistor 444 is depicted as an NMOS transistor. Also note that in the illustrated example, the bypass switch 442 has the same voltage polarity as the transistor 408 used to apply the read voltage. In this example both transistors are PMOS transistors; however, the fast bypass technique can be performed with NMOS transistors or PMOS transistors for any of the transistors 408, 442, and 444. Regardless of the polarity of the bypass transistors 442 and 444, the transistors 442 and 444 are on at opposite times. For example, when the bypass switch 442 is on, the bypass transistor 444 is off. When the bypass switch 442 is off, the bypass transistor 444 is on.

FIG. 5 is a table showing an example of operation of the circuit of FIG. 4 for performance of a fast bypass read. The table 500 shows example voltages at points in the circuit 400 prior to the beginning of the read operation ("Read not started") and during the read operation ("Read"). The voltages during the read operation are shown for three different times in the read operation: pre-threshold ("Pre-threshold time t=0") and two points post-threshold ("Post-threshold time t=1" and "Post-threshold time t=2").

Prior to the start of the read operation ("Read not started"), the voltages are shown as 0V and the transistors are shown as being off. However, the voltages illustrated in the table prior to start of the read may be non-zero values (e.g., some nodes may be pre-charged to non-zero voltages).

At the start of the read, the memory cell is in a pre-threshold state (e.g., the memory cell has not "snapped" or undergone a threshold event). The read voltage at the wordline side (the voltage applied to the gate of the transistor 408) is pre-charged at −x V. In this example, the wordline voltage on the bitline side would be pre-charged to +x V for a total read voltage of 2x V. Regardless of the logic value stored by the memory cell 402 (e.g., logic 1 or logic 0 state (SET or RESET) or other logic value), the transistor 408 would be in sub-threshold conduction and the source bias of the transistor 408 would have a magnitude less than the wordline voltage (e.g., approximately −x V+400 mV in the example in table 500). The source bias of the transistor 408 is also referred to as the "Fast-detection node." The sense amplifier 432 reference voltage is pre-charged to the same value as the voltage at the fast detection node pre-threshold (e.g., −x V+400 mV). At this point, the sense amplifier 432 output is pre-charged to a negative voltage (e.g. −3V) via the bypass control signal. In the pre-threshold state, because the sense amplifier 432 output is negative, the bypass switch 442 is selected ("on") and the bypass transistor 444 is off.

Immediately after the cell thresholds (post-threshold time t=1), the source of the transistor 408 at the fast-detection node will become more positive. In the example illustrated in the table 500, the fast-detection node transitions from −x V+400 mV to −x V+600 mV due to the thresholding of the memory cell 402.

At post-threshold time t=2, the output of the sense amplifier 432 flips from −3V to +3V due to the difference in voltages at the input terminals of the sense amplifier 432

(e.g., the voltage at the fast-detection node becoming more positive than the threshold_ref voltage). The sense amplifier 432 output, due to the feedback loop, will deselect the bypass switch 442 and also turn on the bypass transistor 444. Turning on the bypass transistor 444 causes the transistor 408 to be bypassed, which results in the wordline path being connected to a higher current supply. In the illustrated example, the read voltage supplied via the transistor 408 is bypassed and the wordline path is coupled with the VNN maximum negative supply. The magnitude of the voltage at the fast detection node increases (e.g., from −x V+600 mV to −x V-1V). Thus, the limitations imposed by the lower read voltage can be eliminated and the maximum current that can be sustained by the external supply can be provided through the memory cell. FIG. 2 shows an example of a higher current (e.g., current 214 and 220).

The same higher current is also used to sense the state of the memory cell. In the illustrated example, the same sensing signal as before is used, just at a higher current. For example, referring to FIG. 4, the sense amplifier 415 is used to detect current through the path 409 relative to the read-reference current to determine the state of the memory cell. Thus, the fast-detection node is not used as the sensing signal. The sensing timing requirements are typically dictated by multiple factors (e.g., high threshold voltage cells, allowing sensing circuits to complete to elaborate the signal, etc.). In the example illustrated in FIG. 4, and without any additional control logic, the source bias of the transistor 408 is used as soon as the snap signal is generated to bypass the transistor 408 so the VNN supply is connected and a higher current can be applied. The higher read current can also increase the signal-to-noise ratio assuming a current sensing scheme. A voltage sensing scheme is also possible. In this case, the increase in the current post-threshold will also further increase the sensing voltage signal.

Thus, the circuit and table in FIGS. 4 and 5 illustrate on example of a fast bypass read scheme. Other circuit variations may also be used to perform a fast bypass read scheme. For example, FIG. 4 illustrates a fast bypass read scheme on the wordline side of the memory cell. The same type of feedback loop to bypass switch and transistor can also (or alternatively) be included on the bitline side. Including a fast bypass circuit on both the wordline and bitline sides can further increase the voltage bias for current delivery.

In another example, the same scheme can be applied if wordline and/or bitline bias are applied in a direct-supply method (rather than using a source follower/cascode such as the transistor 408). In this case there are two voltage supplies (e.g., a first and second voltage supply) and the bypass circuitry is to switch from the first voltage supply to a second voltage supply responsive to detection of thresholding of the memory cell. In one such example, the bypass transistor switches the entire path from the wordline (or bitline) read-supply bias to the VNN (or VPP) supply. In both the source follower and direct-supply circuits, the maximum read current is limited by the delta bias between the wordline read bias and local wordline selector gate bias. Switching to the VNN supply will enable higher current because the upper voltage range would be higher (e.g., in an example where the wordline read bias −x V, the VNN supply may be something larger in magnitude such as −x V-1V).

Figure 6:
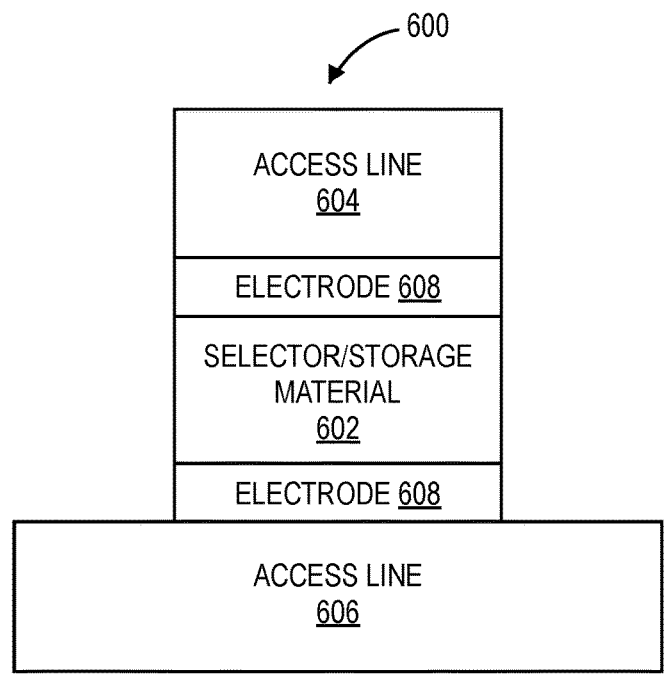
FIG. 6 is an example of a crosspoint memory cell.

FIG. 6 illustrates an example of a crosspoint memory cell that can be accessed using techniques described herein.

FIG. 6 illustrates a memory cell 600. The memory cell 600 includes one or more layers of material 602 to store data and aid in selection of the memory cell 100. For example, the memory cell 600 can include a storage material 602, a selector material, or both, between access lines 604 and 606. In one example, the memory cell includes a layer of storage material and a separate layer of selector material. In one example, the selector is a device with a threshold voltage and the storage element is a device with a tunable threshold voltage. In one example, the memory cell 600 includes a self-selecting material that exhibits both memory and selection effects. A self-selecting material is a storage material that enables selection of a memory cell in an array without requiring a separate layer of material for selection of the cell. In one example, a self-selecting memory cell includes a single layer of material that acts as both a selector element to select the memory cell and a memory element to store a logic state. A material exhibits memory effects if the material can be put in one of multiple stable states (e.g., via a write operation), and subsequently read back (e.g., via a read operation).

The techniques described herein apply generally to crosspoint memory and are not dependent on or specific to a particular storage material. However, some non-limiting examples of storage material follow.

In some examples, the storage material is a phase change material. In other examples, the storage material can be in one or multiple stable states without a change in phase. In one example, the memory element, switching element, or both are amorphous semiconductor threshold switches (e.g., ovonic threshold switches) using an amorphous material such as an amorphous chalcogenide material or other amorphous material. An ovonic threshold switch remains in an amorphous state which distinguishes it from an ovonic memory, which generally changes between amorphous and crystalline states. In one example, an ovonic memory is used in series with an ovonic threshold switch. In such case, the ovonic threshold switch operates as the select device for the ovonic memory. Whether the memory material of the memory cell changes phase or not, in one example, the memory could be referred to as a resistance-based memory. In a resistance-based memory, the bit stored by a memory cell is based on the resistive state of the memory cell.

Examples of storage material can include one or more of: tellurium (Te), selenium (Se), germanium (Ge), antimony (Sb), bismuth (Bi), lead (Pb), tin (Sn), indium (In), silver (Ag), arsenic (As), sulfur (S), phosphorus (P), molybdenum (Mo), gallium (Ga), aluminum (Al), oxygen (O), nitrogen (N), chromium (Cr), gold (Au), niobium (Nb), palladium (Pd), cobalt (Co), vanadium (V), nickel (Ni), platinum (Pt), titanium (Ti), tungsten (W), tantalum (Ta) or other materials. For example, the storage material may include one or more chalcogenide materials such as such as Te—Se, Ge—Te, In—Se, Sb—Te, Ge—Sb, Ta—Sb—Te, Ga—Sb, In—Sb, As—Te, As—Se, Al—Te, As—Se—Te, Ge—Sb—Te, Ge—As—Se, Te—Ge—As, V—Sb—Se, Nb—Sb—Se, In—Sb—Te, In—Se—Te, Te—Sn—Se, V—Sb—Te, Se—Te—Sn, Ge—Se—Ga, Mo—Sb—Se, Cr—Sb—Se, Ta—Sb—Se, Bi—Se—Sb, Mo—Sb—Te, Ge—Bi—Te, W—Sb—Se, Ga—Se—Te, Ge—Te—Se, Cr—Sb—Te, Sn—Sb—Te, W—Sb—Te, Sn—Sb—Bi, In—Sb—Ge, As—Sb—Te, Ge—Te—Ti, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Se—Te—In, As—Ge—Sb—Te, Se—As—Ge—In, Ge—Sb—Se—Te, Ge—Sn—Sb—Te, Ge—Te—Sn—Ni, Ge—Te—Sn—Pd, and Ge—Te—Sn—Pt, Si—Ge—As—Se, In—Sn—Sb—Te, Ge—Se—Te—Si, Si—Te—As—Ge, Ag—In—Sb—Te, Ge—Se—Te—In—Si, Se—As—Ge—Si—In, or other materials capable of being programmed to one of multiple states. One or more elements in a chalcogenide material may be dopants. For example, the storage material may include dopants such as: aluminum (Al), oxygen (O), nitrogen (N), silicon (Si), carbon (C), boron (B), zirconium (Zr), hafnium (Hf), or a combination thereof. The storage material may include other materials or dopants not explicitly listed.

As mentioned above, some memory cells include a separate layer of selector material to form a selector device. The selector material may include a chalcogenide material (e.g., a chalcogenide glass) or other material capable of operating as a selection element. In one example, the selector material includes one or more of: silicon (Si), germanium (Ge), selenium (Se), arsenic, tellurium (Te), or other materials. In one example, the selector material includes Si—Ge—As—Se, As—Ge—Te—Si, or other selector material. The selector material may also include dopants such as: aluminum (Al), oxygen (O), nitrogen (N), silicon (Si), carbon (C), boron (B), zirconium (Zr), hafnium (Hf), or a combination thereof. The selector material may include other materials or dopants not explicitly listed.

The access lines 604, 606 electrically couple the memory cell 100 with circuitry that provides power to and enables access to the memory cell 100. The term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data. The access lines 604, 606 can be referred to as a bit line and word line, respectively. The word line is for accessing a particular word in a memory array and the bit line is for accessing a particular bit in the word. The access lines 604, 606 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one example, electrodes 608 are disposed between storage material 602 and access lines 604, 606. Electrodes 608 electrically couple access lines 604, 606 with storage material 602. A memory cell with separate layers of storage and selector material may also include an electrode between the layers of storage and selector material. Electrodes 608 can be composed of one or more conductive and/or semiconductive materials such as, for example: carbon (C), carbon nitride ($C_xN_y$); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials.

Figure 7:
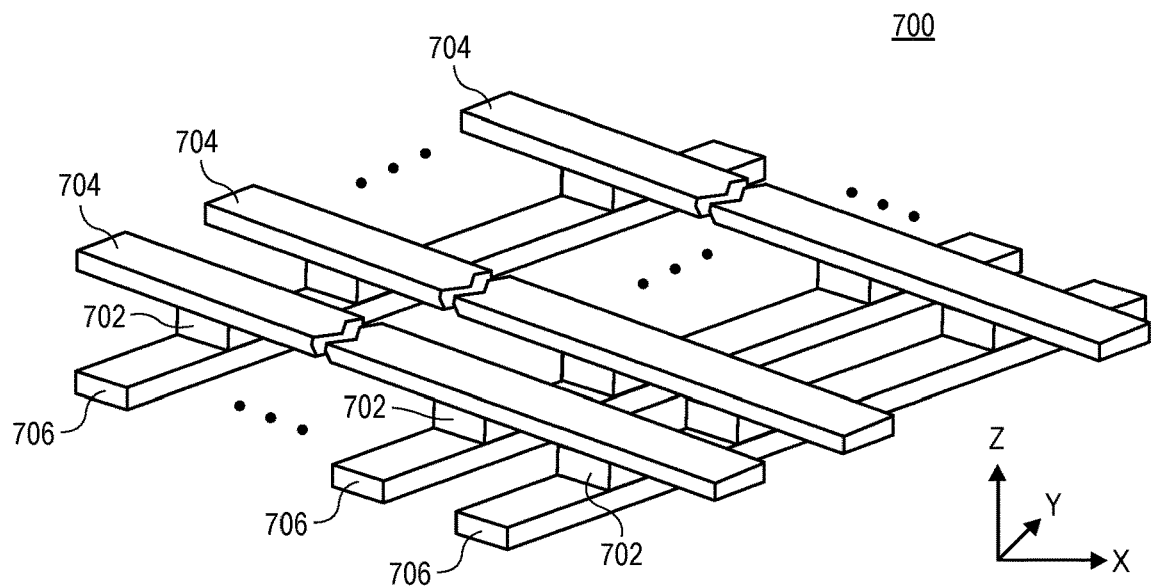
FIG. 7 illustrates an example of a portion of a memory cell array.

FIG. 7 illustrates a portion of a memory cell array 700, which can include a memory cell such as the memory cell 106 of FIG. 1 or memory cell 600 of FIG. 6. The memory cell array 700 is an example of a crosspoint memory array.

The memory cell array 700 includes a plurality of access lines 704, 706, which can be the same or similar as the access lines 604, 606 described with respect to FIG. 6. Access lines 704, 706 can be referred to as bit lines and word lines. In the example illustrated in FIG. 7, the bit lines (e.g., access lines 704) are orthogonal to the word lines (e.g., access lines 706). A storage material 702 is disposed between the access lines 704, 706. In one example, a "cross-point" is formed at an intersection between a bit line and a word line. A memory cell is created from the storage material 702 between the bit line and word line where the bit line and word line intersect. The storage material 702 can be a chalcogenide material, phase change material, both a chalcogenide material and phase change material, or other storage material. In one example, the access lines 704, 706 are composed of one or more conductive materials such as the access lines 604, 606 described above with respect to FIG. 6.

Although a single level or tier of memory cells is shown in FIG. 7 for the sake of clarity, memory cell array 700 typically includes multiple levels or tiers of non-volatile memory cells (e.g., in the z-direction). Nonvolatile memory devices including multiple tiers of cross-point memory cells may be referred to as three-dimensional (3D), multi-level, or multi-tiered cross-point memory devices. The FIGS. 6 and 7 illustrate an example of a memory cell and array in which the fast read techniques described herein may be implemented. However, the techniques described herein can be implemented in memory cell structures and arrays having different materials or structures than the examples described in FIGS. 6 and 7.

Figure 8:
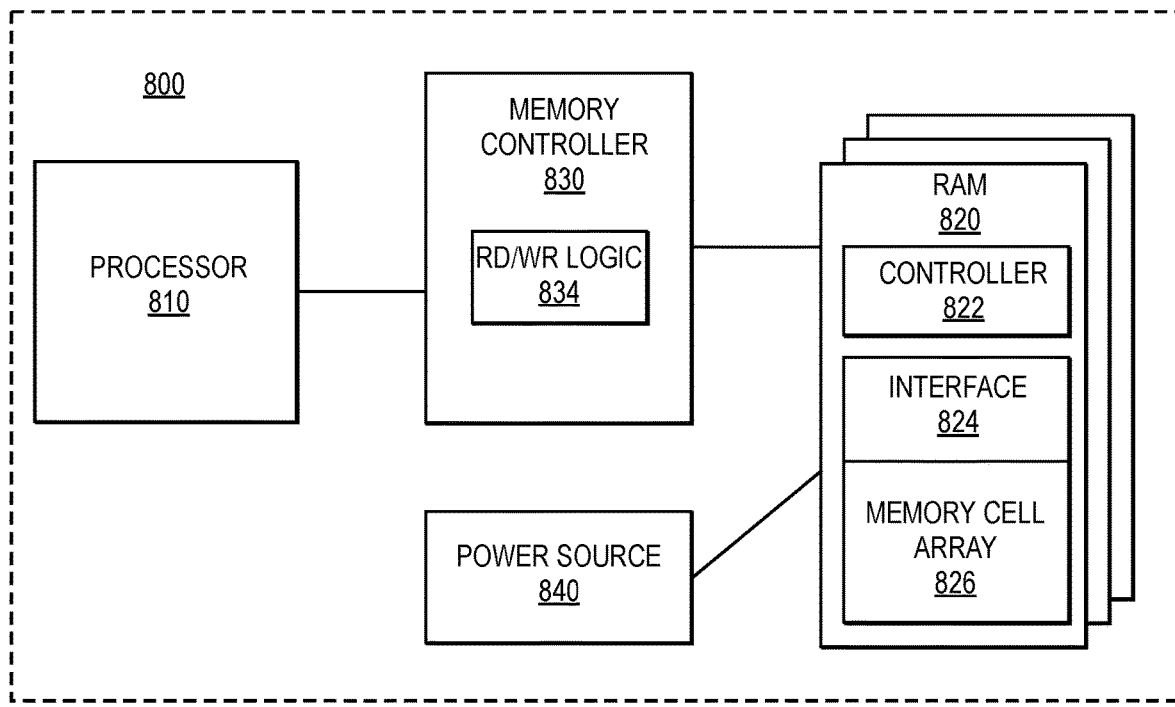
FIG. 8 is a block diagram of a system that can include a non-volatile memory device that implements access techniques described herein.

FIG. 8 is a block diagram of a system that can include a non-volatile memory device in accordance with examples described herein.

System 800 includes components of a memory subsystem having random access memory (RAM) 820 to store and provide data in response to operations of processor 810. The system 800 receives memory access requests from a host or a processor 810, which is processing logic that executes operations based on data stored in RAM 820 or generates data to store in RAM 820. The processor 810 can be or include a host processor, central processing unit (CPU), microcontroller or microprocessor, graphics processor, peripheral processor, application specific processor, or other processor, and can be single core or multicore.

The system 800 includes a memory controller (e.g., a host memory controller) 830, which represents logic to interface with RAM 820 and manage access to data stored in the memory. In one example, the memory controller 830 is integrated into the hardware of processor 810. In one example, the memory controller 830 is standalone hardware, separate from the processor 810. The memory controller 830 can be a separate circuit on a substrate that includes the processor. The memory controller 830 can be a separate die or chip integrated on a common substrate with a processor die (e.g., as a system on a chip (SoC)). In one example, the memory controller 830 is an integrated memory controller (iMC) integrated as a circuit on the processor die. In one example, at least some of RAM 820 can be included on an SoC with the memory controller 830 and/or the processor 810.

In the illustrated example, the memory controller 830 includes read/write logic 834, which includes hardware to interface with the RAM 820. The logic 834 enables the memory controller 830 to generate read and write commands to service requests for data access generated by the execution of instructions by processor 810.

The memory resources or cachelines in the RAM 820 are represented by a memory cell array 826, which can include a cross-point array. The RAM 820 includes an interface 824 (e.g., interface logic) to control the access to the memory device array 826. The interface 824 can include decode logic, including logic to address specific rows or columns, bit lines or word lines, or otherwise address specific bits of data. The controller 822 represents an on-die and/or on-package (e.g., in the same package as the memory array) controller on RAM 820 to control its internal operations to execute commands received from memory controller 830. For example, the controller 822 can control any of timing, voltage levels, addressing, I/O (input/output) margining, scheduling, and error correction for RAM 820.

The controller 822 includes input/output (I/O) circuitry to receive a memory access command to access (e.g., read or write) a memory cell of the crosspoint memory array. In one example, the controller 822 is configured to read and write to the memory device array 826 (e.g., via set and reset operations) in accordance with any example described herein. A power source 840 is connected to the RAM 820 to provide one or more voltage rails for operation of the RAM 820.

Figure 9:
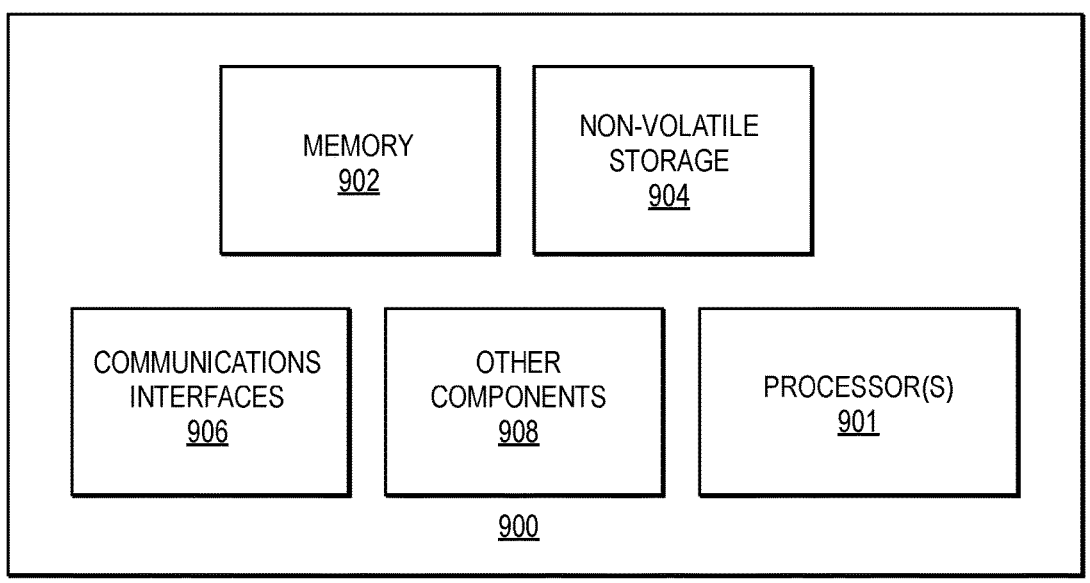
FIG. 9 provides an exemplary depiction of a computing system that can include a non-volatile memory device that implements access techniques described herein.

FIG. 9 provides an exemplary depiction of a computing system 900 (e.g., a smartphone, a tablet computer, a laptop computer, a desktop computer, a server computer, etc.). As observed in FIG. 9, the system 900 may include one or more processors or processing units 901. The processor(s) 901 may include one or more central processing units (CPUs), each of which may include, e.g., a plurality of general-purpose processing cores. The processor(s) 901 may also or alternatively include one or more graphics processing units (GPUs) or other processing units. The processor(s) 901 may include memory management logic (e.g., a memory controller) and I/O control logic. The processor(s) 901 can be similar to, or the same as, the processor 810 of FIG. 8.

The system 900 also includes memory 902 (e.g., system memory), non-volatile storage 904, communications interfaces 906, and other components 908. The other components may include, for example, a display (e.g., touchscreen, flat-panel), a power supply (e.g., a battery or/or other power supply), sensors, power management logic, or other components. The communications interfaces 906 may include logic and/or features to support a communication interface. For these examples, communications interface 906 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more Ethernet standards promulgated by IEEE. For example, one such Ethernet standard may include IEEE 802.3. Network communication may also occur according to one or more OpenFlow specifications such as the OpenFlow Switch Specification. Other examples of communications interfaces include, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 904, which may be the mass storage component of the system. The non-volatile storage 904 can be similar to, or the same as, the RAM 820 of FIG. 8, described above. Non-volatile storage 904 may include byte or block addressable types of non-volatile memory having a cross-point memory structure. Non-volatile types of memory may also include other types of byte or block addressable non-volatile memory such as, but not limited to, multi-threshold level NAND flash memory (e.g., 3D NAND flash memory), NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), or a combination of any of the above. In one example, the non-volatile storage 904 may include mass storage that is composed of one or more SSDs (solid state drives), DIMMs (dual in line memory modules), or other module or drive. The non-volatile storage 904 may implement fast bypass read techniques in accordance with examples described herein.

Thus, a fast reach scheme can solve the technical problem arising related to the delivery of a relatively low read voltage to threshold the memory cell, and at the same time, the delivery of the relatively high current to avoid or improve Read-Disturb (RD) and increase the Sensing Signal. The switching event to a SET/1 bit during the read operation is detected as soon as possible outside the array, either on the wordline or on the bitline side, through a sense amplifier. Once the output of sense amplifier is flipped (cell is SET/1), the sense amplifier output signal itself is used (feedback loop) both to deselect the sense amplifier from the array and to connect the wordline (and/or bitline) bias, previously at the read voltage, to a higher voltage (negative or positive supply depending if sense amplifier is located on the wordline or bitline side). The wordline path (and/or bitline path) is then connected to the maximum wordline supply (or bitline supply) which can sustain higher currents.

With the read scheme disclosed herein, the time at optimum current to minimize read disturb can be maximized because the optimum higher current is applied as soon as the threshold event occurs. This scheme can also enable an increase in the sensing signal/noise ratio, since the max read current delivered is used to sense the signal or is converted into a voltage to sense the signal.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A circuit comprising:
   a crosspoint memory cell;
   first circuitry to generate a first read voltage across the crosspoint memory cell, the first circuitry including a first transistor between the crosspoint memory cell and a current source; and
   bypass circuitry coupled across the first transistor of the first circuitry, the bypass circuitry to:
   detect thresholding of the crosspoint memory cell, and bypass the first transistor of the first circuitry responsive to the detection of thresholding of the crosspoint memory cell.

2. The circuit of claim 1, wherein the bypass circuitry to detect thresholding of the crosspoint memory cell is to:
   detect the thresholding of the crosspoint memory cell based on detection of a change in voltage at a node between a selection transistor and the first circuitry.

3. The circuit of claim 1, wherein:
   the first circuitry comprises a first voltage supply; and
   the bypass circuitry is to switch from the first voltage supply to a second voltage supply responsive to detection of thresholding of the crosspoint memory cell.

4. The circuit of claim 1, wherein:
   the bypass circuitry comprises a sense amplifier to detect the thresholding of the crosspoint memory cell.

5. The circuit of claim 4, wherein:
   the sense amplifier is to detect the thresholding of the crosspoint memory cell based on a change in voltage at a node between a selection transistor and the first circuitry relative to a reference voltage.

6. The circuit of claim 4, wherein:
   the bypass circuitry is to pre-charge an output of the sense amplifier to the same voltage as the first read voltage at or prior to start of a read operation.

7. The circuit of claim 5, wherein:
   the bypass circuitry comprises a first bypass transistor between the node and an input of the sense amplifier; and
   an output of the sense amplifier is coupled with a gate of the first bypass transistor.

8. The circuit of claim 7, wherein:
   the bypass circuitry comprises a second bypass transistor coupled across the first circuitry, the second bypass transistor to be on when the first bypass transistor is off; and
   the output of the sense amplifier is coupled with a gate of the second bypass transistor.

9. The circuit of claim 1, wherein:
   the crosspoint memory cell comprises a phase change memory element.

10. The circuit of claim 1, further comprising:
    second circuitry to generate a second read voltage across the crosspoint memory cell, wherein total voltage across the crosspoint memory cell is based on a difference between first read voltage and the second read voltage; and
    second bypass circuitry coupled with the second circuitry, the second bypass circuitry to:
    detect thresholding of the crosspoint memory cell, and bypass the second circuitry responsive to detection of thresholding of the crosspoint memory cell.

11. The circuit of claim 10, wherein:
    the first circuitry is between a wordline selection transistor and a wordline supply voltage; and
    the second circuitry is between a bitline selection transistor and a bitline supply voltage.

12. The circuit of claim 1, further comprising:
    sense circuitry to determine a state of the crosspoint memory cell based on detection of current through the crosspoint memory cell.

13. A memory device comprising:
    a crosspoint memory array; and
    input/output (I/O) circuitry to receive a memory access command to read a crosspoint memory cell of the crosspoint memory array;
    a circuit to read the crosspoint memory cell, the circuit including:
    first circuitry to generate a first read voltage across the crosspoint memory cell; and
    bypass circuitry coupled with the first circuitry, the bypass circuitry including:
    a sense amplifier to detect thresholding of the crosspoint memory cell, and
    circuitry to pre-charge an output of the sense amplifier to the same voltage as the first read voltage at or prior to start of a read operation, and bypass the first circuitry responsive to the detection of thresholding of the crosspoint memory cell.

14. The memory device of claim 13, wherein the bypass circuitry to detect thresholding of the crosspoint memory cell is to:
    detect the thresholding of the crosspoint memory cell based on detection of a change in voltage at a node between a selection transistor and the first circuitry.

15. The memory device of claim 13, wherein:
    the first circuitry comprises a first transistor between the crosspoint memory cell and a current source; and
    the bypass circuitry is coupled across the first transistor to bypass the first transistor responsive to the detection of thresholding of the crosspoint memory cell.

16. The memory device of claim 13, wherein:
    the first circuitry comprises a first voltage supply; and
    the bypass circuitry is to switch from the first voltage supply to a second voltage supply responsive to detection of thresholding of the crosspoint memory cell.

17. A system comprising:
    a memory controller; and
    a memory die in a same package as the memory controller, the memory die comprising:
    a crosspoint memory array; and
    a circuit to read a crosspoint memory cell of the crosspoint memory array, the circuit including:
    first circuitry to generate a first read voltage across the crosspoint memory cell, the first circuitry including a first transistor between the crosspoint memory cell and a current source; and
    bypass circuitry coupled across the first transistor of the first circuitry, the bypass circuitry to:
    detect thresholding of the crosspoint memory cell, and
    bypass the first transistor of the first circuitry responsive to the detection of thresholding of the crosspoint memory cell.

18. The system of claim 17, further comprising:
    one or more of: a processor, a host memory controller, a display, and a power source.

19. The memory device of claim 13, wherein:
    the sense amplifier is to detect the thresholding of the crosspoint memory cell based on a change in voltage at a node between a selection transistor and the first circuitry relative to a reference voltage.

20. The memory device of claim 19, wherein:
the bypass circuitry comprises a first bypass transistor between the node and an input of the sense amplifier; and
an output of the sense amplifier is coupled with a gate of the first bypass transistor.

\* \* \* \* \*